United States Patent
Bosselmann et al.

(10) Patent No.: US 6,512,357 B2
(45) Date of Patent: Jan. 28, 2003

(54) POLARIMETRIC SENSOR FOR THE OPTICAL DETECTION OF A MAGNETIC FIELD AND POLARIMETRIC SENSOR FOR THE OPTICAL DETECTION OF AN ELECTRIC CURRENT

(75) Inventors: Thomas Bosselmann, Marloffstein (DE); Stephan Mohr, Jena (DE); Michael Willsch, Fürth (DE)

(73) Assignee: Siemens Aktiengellschaft, Munich (DE)

( * ) Notice: Subject to any disclaimer, the term of this patent is extended or adjusted under 35 U.S.C. 154(b) by 28 days.

(21) Appl. No.: 09/771,676

(22) Filed: Jan. 29, 2001

(65) Prior Publication Data

US 2001/0043064 A1 Nov. 22, 2001

(30) Foreign Application Priority Data

Jul. 29, 1998 (DE) .......................... 198 34 219

(51) Int. Cl.$^7$ ............................................. G01R 33/032
(52) U.S. Cl. ...................................... 324/96; 324/117 R
(58) Field of Search ................ 324/96, 117 R, 324/117 H, 244.1; 359/258, 280; 385/92, 88, 84

(56) References Cited

U.S. PATENT DOCUMENTS

| | | | |
|---|---|---|---|
| 4,531,092 A | | 7/1985 | Shibano |
| 4,560,932 A | | 12/1985 | Mitsui et al. |
| 4,812,767 A | | 3/1989 | Taketomi |
| 5,008,611 A | | 4/1991 | Ulmer, Jr. |
| 5,201,018 A | * | 4/1993 | Coden et al. ............. 385/88 |
| 5,463,313 A | * | 10/1995 | Berkcan ............. 324/117 R |
| 5,475,489 A | * | 12/1995 | Gottsche ............. 356/364 |
| 5,719,497 A | | 2/1998 | Veeser et al. |
| 6,037,770 A | * | 3/2000 | Itoh et al. ............. 324/244.1 |

FOREIGN PATENT DOCUMENTS

| | | |
|---|---|---|
| DE | 2 017 863 | 11/1970 |
| DE | 39 42 547 A1 | 6/1991 |
| EP | 0 473 429 A2 | 3/1992 |
| EP | 0 473 429 B1 | 1/1997 |

OTHER PUBLICATIONS

Japanese Patent Abstract No. 03231177 (Satoshi), dated Oct. 15, 1991.
"Development of Optical Current Transformers and Application to Fault Location Systems for Substations" (Yamagata et al.). (Date unavailable).
"Plastic Fiber Optical Isolator and Current Sensor" (Muto et al.), dated Jan. 18, 1992, Japanese Journal of Applied Physics, Part 2, No. 3b, pp. 346–348.
"Magnetic–Field sensor using plastic optical fiber and polycrystalline CdMnTe" (Guerrero et al.), dated Jan. 26, 1993, Sensors and Actuators, No. 1, pp. 25–27.

* cited by examiner

*Primary Examiner*—Vinh P. Nguyen
(74) *Attorney, Agent, or Firm*—Laurence A. Greenberg; Werner H. Stemer; Ralph E. Locher (57) ABSTRACT

A polarimetric sensor includes a sensor unit constructed as a permanently assembled unit having a polarizer, a sensor element and an analyzer. An input optical waveguide and an output optical waveguide with a core diameter of at least 100 μm are provided. A first light signal emerging from the input optical waveguide passes directly through the sensor unit and enters the output optical waveguide as a second light signal. An optical path of the first light signal through the sensor element is no longer than 50 times the core diameter of the output optical waveguide. No separate focussing or collimation optics are provided.

19 Claims, 2 Drawing Sheets

POLARIMETRIC SENSOR FOR THE OPTICAL DETECTION OF A MAGNETIC FIELD AND POLARIMETRIC SENSOR FOR THE OPTICAL DETECTION OF AN ELECTRIC CURRENT

CROSS-REFERENCE TO RELATED APPLICATION

This application is a continuation of copending International Application No. PCT/DE99/02226, filed Jul. 16, 1999, which designated the United States.

BACKGROUND OF THE INVENTION

Field of the Invention

The invention relates to a polarimetric sensor for the optical detection of a measured variable. In particular, the invention relates to a magnetic field sensor or an electric field sensor.

It is known to provide an optical magnetic field sensor for detecting a magnetic field, which in particular is caused by an electric current flowing in a current conductor. The Faraday effect is used in that case. Such a magnetic field sensor is also referred to as a magnet-optical current converter. The Faraday effect is understood to mean the rotation of the plane of polarization of linearly polarized light which is being propagated in a medium in the presence of a magnetic field. The angle of that rotation is proportional to a path integral of the magnetic field along a path traced by the light, with the Verdet constant as a proportionality constant. The Verdet constant is in turn dependent on the material in which the light is being propagated and on the wavelength of the light. A Faraday element in the form of an optically transparent material exhibiting the Faraday effect is disposed in the vicinity of the current conductor in order to measure the current. Linearly polarized light is coupled into the Faraday element. The magnetic field produced by the electric current has the effect of rotating the plane of polarization of the light being propagated in the Faraday element by a polarization rotation angle, which is evaluated by an evaluation unit as a measure of the strength of the magnetic field and therefore of the intensity of the electric current.

It is also known to provide an optical sensor for detecting an electric field (E-field sensor) and it is possible for the electric field to be caused, in particular, by an electric voltage. In that case, use is made of the Pockels effect, for example. Such an E-field sensor is also referred to as an electro-optical converter. The Pockels effect is understood to mean the phase shift caused by the electric field between two mutually orthogonal polarization components of light, in particular circularly polarized light, which is being propagated in a medium in the presence of an electric field. As a result, the state of circular polarization is generally converted into a state of elliptical polarization. A measured variable for the electric field to be detected may be determined from that change in the polarization.

An article entitled "Development of Optical Current Transformers and Application to Fault Location Systems for Substations" by Y. Yamagata et al., in IEEE Transactions on Power Delivery, Vol. 8, No. 3, July 1993, pages 1 to 7, discloses a magneto-optical current converter which contains a Faraday element made of a volume element formed as a bismuth silicon oxide (BSO) monocrystal. In that case, the acronym "BSO" represents an abbreviation for a crystal having the elemental composition $Bi_{12}SiO_{20}$ or $Bi_4Si_3O_{12}$. That Faraday element is located in an air gap in a magnetic flux concentrator which surrounds an electric conductor carrying current. As a result of the flux concentration, a homogeneous magnetic field results in the air gap, and is virtually exclusively determined by an electric current flowing in the current conductor. Polarized light radiated into the Faraday element changes its plane of polarization under the influence of the magnetic field in the air gap. That polarization modulation is converted into an intensity modulation in an analyzer directly adjacent the Faraday element. The resulting light signal is led through an optical waveguide to an evaluation unit, which calculates the current value from the intensity modulation. The path to be covered by the optical waveguide may amount to several kilometers, depending on the position of the evaluation unit. Glass-fiber optical waveguides are preferably used in the case of such large distances. That is because, due to their low attenuation, they are particularly suitable for an application with a relatively long optical transmission path.

European Patent EP 0 473 429 B1, corresponding to U.S. Pat. No. 5,355,084, discloses a magnetic field sensor which contains a Faraday element in the form of a volume element. In that case, light is led in and out through optical waveguides. In order to focus light emerging from an input optical waveguide to be fed into an output optical waveguide, in each case collimators are provided in the form of spherical or cylindrical lenses. In the case of the magnetic field sensor disclosed, they are needed in order to avoid beam widening of the emergent light and to ensure adequate coupling of light into the very small core cross section of the output optical waveguide. In general, the use of optical waveguides with small core diameters necessitates increased requirements placed upon the adjustment accuracy during production. In the case of monomode optical waveguides, the core diameter is, for example, on the order of magnitude of a few µm. In general, it is currently usual to use special glass-fiber optical waveguides with a very small core cross section for a magnetic field sensor. The components, such as the light source and light receivers, optical waveguides, polarizers and collimators, used in the prior art for the magnetic field sensor, are mostly complicated and therefore expensive special components which, in particular, are matched to the infrared wavelength range.

U.S. Pat. No. 5,475,489 discloses a polarimetric sensor in the form of a magnetic field sensor or an E-field sensor in each case in a reflex configuration. A light signal radiated into a sensor element, which is constructed as a Faraday or Pockels element, is focussed onto an output optical waveguide through the use of at least one reflection element. In that case, the reflection element is complicated to produce and has to be positioned very accurately during assembly in relation to the output optical waveguide.

Furthermore, German Published, Non-Prosecuted Patent Application DE 39 42 547 A1 discloses a magnetic field sensor based on an yttrium iron garnet (YIG), likewise in a reflex configuration. In order to increase sensitivity in the case of that magnetic field sensor, provision is made for the light signal to pass through the YIG sensor element twice. For that reason, a reflex configuration is provided, in which the yttrium iron garnet has a convex end surface that, on one hand, reflects the light signal and, on the other hand, focuses it onto the output optical waveguide. However, an yttrium iron garnet may likewise only be produced with considerable effort. In that case too, great care is necessary during the positioning of the input and output optical waveguides with regard to their configuration relative to the convex end surface of the yttrium iron garnet.

U.S. Pat. No. 4,812,767 discloses a magnetic field sensor in a reflex configuration which, in addition to the polarizer, the Faraday element and the analyzer, contains two prisms, constructed independently of each other, for beam deflection. That structure is located in a cylindrical tube, so that the magnetic field sensor becomes very large overall and also expensive to produce.

U.S. Pat. No. 4,560,932 discloses a further magnetic field sensor, in which the light signal is reflected many times within the Faraday element in order to increase the sensitivity. However, that multiple reflection is associated with beam widening of the light signal, so that after passing through the Faraday element, only a very low proportion of the intensity of the light signal is still coupled into the output optical waveguide. The measurement information may then only be reconstructed from the received light signal with an increased outlay.

U.S. Pat. No. 5,008,611 and German Published, Non-Prosecuted Patent Application 2 017 863 are documents relating to the general prior art in the field of magneto-optical metrology. In both documents, in each case a magnetic field sensor is described which contains more or less complicated beam guidance optics for the light signal. Thus, the magnetic field sensor disclosed by German Published, Non-Prosecuted Patent Application 2 017 863 uses a special lens having front and rear sides which in each case have different radii of curvature and, in addition, have a different reflectance, due to a different type of reflective treatment.

SUMMARY OF THE INVENTION

It is accordingly an object of the invention to provide a polarimetric sensor for the optical detection of a magnetic field and a polarimetric sensor for the optical detection of an electric current, which overcome the hereinafore-mentioned disadvantages of the heretofore-known devices of this general type and can be produced more simply and consequently more inexpensively. In particular, use is to be made of standard components which are as simple as possible to produce and therefore inexpensive. In addition, requirements placed on production with regard to adjustment tolerance are to be reduced.

With the foregoing and other objects in view there is provided, in accordance with the invention, a polarimetric sensor for the optical detection of a magnetic field, comprising a flux concentrator having an air gap and effecting an essentially uniform field orientation of a magnetic field in the air gap. A permanently assembled sensor unit disposed in the air gap includes at least one polarizer, a Faraday element sensitive to the magnetic field and an analyzer. An input optical waveguide and an output optical waveguide with a core diameter of at least 100 $\mu$m, are provided. The sensor unit, the input optical waveguide and the output optical waveguide are configured to cause a first light signal emerging from the input optical waveguide to enter the sensor unit in uncollimated and unfocussed form, then to pass through the sensor unit and then to enter the output optical waveguide in uncollimated and unfocussed form as a second light signal. The Faraday element defines an optical path of the first light signal through the Faraday element having a length of at most 50 times the core diameter of the output optical waveguide. A prism block being transparent in a wavelength range being used is disposed in the air gap and the sensor unit is embedded in the prism block. The prism block has two bores formed therein perpendicularly to the field orientation for receiving the input optical waveguide and the output optical waveguide. The prism block has two prism surfaces each inclined at 45° to the field orientation and each effecting a 90° deflection of the first light signal and the second light signal.

The invention is based on the finding that a polarimetric sensor can also be constructed with an output optical waveguide having a relatively large core diameter. In particular, the large-core optical waveguide being used is a standard product in optical telecommunications technology, and is therefore very cost-effective.

Due to the large core diameter, the polarimetric sensor can also be constructed with considerably lower requirements on the adjustment accuracy. Conventional production tolerances on the order of magnitude of the core diameter of the output optical waveguide (about 100 $\mu$m) can readily be tolerated at this point. This simplifies the production considerably.

In addition, a further finding of the invention is that a polarimetric sensor may also be constructed without any separate focussing and/or collimation optics. To this end, the sensor unit and the input and output optical waveguides are placed in such a way that the first light signal, after emerging from the input optical waveguide, is fed directly into the sensor unit and from there in turn directly into the output optical waveguide. In this connection, "directly" is understood to mean that no further optical components, in particular no measures for focussing and/or collimation, are interposed. Beam deflection and short optical paths between the input/output optical waveguides and the sensor unit in this case are to be subsumed under the term "directly".

In addition, the sensor unit, which is constructed as a permanently assembled unit, contributes to the fact that the beam widening remains small, and the polarimetric sensor manages without any focussing and/or collimation optics. The permanently assembled unit in this case is achieved, for example, by adhesively bonding the polarizer and the analyzer onto the sensor element through the use of an extremely thin adhesive layer, or else by snapping the polarizer and the analyzer directly onto the sensor element. The thickness of the adhesive layer which may be present is then preferably at most a few $\mu$m, which suppresses interfering influences arising from birefringence. The resulting close joint additionally minimizes the optical path between the polarizer, the sensor element and the analyzer. This has a positive effect on the beam widening of the first light signal, which is to be kept as low as possible. If appropriate, a further element, for example in the form of a $\lambda/4$ or $\pi/2$ phase shifter may be present between the sensor element, on one side, and the polarizer or the analyzer, on the other side.

If the path of the first light signal through the sensor element also corresponds at most to 50 times the core diameter of the output optical waveguide, this leads to beneficial, low beam widening. Then, a large proportion of the first light signal is fed as a second light signal into the output optical waveguide.

In accordance with another feature of the invention, the path of the first light signal through the sensor element corresponds at most to ten times the core diameter of the output optical waveguide. In a polarimetric sensor constructed in this way, the result is then particularly low beam widening, so that any separate measures for beam focussing and/or collimation are superfluous.

In accordance with a further feature of the invention, plastic optical waveguides are employed for the input or the output optical waveguides or else for both. These optical waveguides are very cost-effective and therefore particularly suitable for the present application. The optical waveguide being used is formed in particular of polymethyl methacrylate (PMMA=PLEXIGLAS), a standard material for plastic optical waveguides.

In accordance with an added feature of the invention, the output optical waveguide has a core diameter of at least 500 µm. Particular preference is given to a core diameter of at least 1 mm. The greater the core diameter is selected to be at this point, the lower the requirements are on the accuracy of the positioning of the individual components during adjustment. The core diameter of the input optical waveguide is of far lower importance in this regard. It can therefore also be below that of the output optical waveguide.

In accordance with an additional feature of the invention, multimode optical waveguides are provided both for the input optical waveguide and for the output optical waveguide. In addition to price advantages, this type of optical waveguide, with its large core diameters, offers advantages, in particular for the output optical waveguide, in coupling-in the first light signal. Since this criterion is not critical for the input optical waveguide, as already mentioned, in an alternative embodiment it can also be constructed as a monomode optical waveguide. A further configuration provides for that fiber end of the input optical waveguide which faces the sensor unit to be rounded. This rounding is produced, for example, through the use of a heat treatment of the fiber end. The rounding then has a slightly collimating effect on the first light signal emerging from the input optical waveguide.

In accordance with yet another feature of the invention, the polarimetric sensor is constructed for operation in the visible wavelength range. There is a great multiplicity of standard components for light sources and receivers and for polarizers and optical waveguides for these wavelengths. Since this increasingly applies to the infrared wavelength range as well, the magnetic field sensor in another variant operates with infrared light.

It is beneficial that the sensor element constitutes a Faraday element. The Faraday element changes the state of polarization of a passing light signal under the influence of a magnetic field to be detected. The polarimetric sensor is therefore a magnetic field sensor.

In accordance with yet a further feature of the invention, the sensor unit includes a Faraday element which, in particular, is configured in the form of a volume element. A preferred material selection of the Faraday element is a BSO or BGO monocrystal, a ferromagnetic material or a flint glass. In this case, BSO and BGO are understood to mean bismuth silicone oxide and bismuth germanium oxide, respectively. Possible forms are $Bi_{12}SiO_{20}$, $Bi_4Si_3O_{12}$, $Bi_{12}GeO_{20}$ or $Bi_4Ge_3O_{12}$. A ferromagnetic material which is considered in this case is, in particular, a rare earth garnet. A suitable substance of this type is, for example, YIG (Yttrium Iron Garnet).

It is advantageous that the sensor unit with the Faraday element is located in the air gap in the flux concentrator. The flux concentrator effects focussing and therefore, so to speak, reinforcement of the magnetic field to be detected. The sensor unit is then subjected, within the air gap, to a focussed magnetic field with an essentially uniform field orientation. This increases the measurement effect.

In accordance with yet an added feature of the invention, the prism block that is transparent in the wavelength range being used and is located in the air gap in the flux concentrator is formed of plastic. As mentioned above, the sensor unit with the Faraday element is disposed in a recess in this prism block and two bores accommodate the input and the output optical waveguides. The bores run at right angles to the field orientation, so that the first light signal emerging from the input optical waveguide is firstly deflected at right angles at a prism surface inclined at 45° to the field orientation, in order to then pass through the sensor unit parallel to the field orientation. Then, the first light signal experiences a second 90° deflection at a further prism surface inclined at 45° to the field orientation, after which it is coupled into the output optical waveguide. The above-described prism block thus effects beam reversal of the first light signal coupled out of the input optical waveguide. This is therefore a reflex construction. The prism block makes simple and compact assembly possible, since both the recess to accommodate the sensor unit and the bores to accommodate the two optical waveguides can be produced in a simple way. Final assembly is therefore restricted merely to the introduction of the sensor unit and the two optical waveguides into the prefabricated prism block. All of the optical components are then automatically located in the correct position relative to one another. Due to the large cross section of the output optical waveguide, the conventional fabrication tolerances of about 0.1 mm can readily be tolerated at this point.

In accordance with a concomitant feature of the invention, the prism block is formed of a material which has a refractive index approximately equal to that of the two optical waveguides. The effect of this measure is that the widening of the first light signal in the prism block turns out to be low, and therefore a high proportion of the first light signal is coupled into the output optical waveguide.

Another advantageous embodiment is a reflection-free structural variant of the magnetic field sensor, in which the two optical waveguides are led up to the sensor unit disposed in the air gap through the use of two bores in the flux concentrator. In this case, the bores run parallel to the field orientation of the magnetic field in the air gap. This means that the first light signal emerging from the input optical waveguide is coupled directly into the sensor unit and the output optical waveguide. Beam reversal or deflection is not provided in the case of this purely transmissive structural variant. It is particularly beneficial if the sensor unit is in direct contact with the two optical waveguides with regard to the lowest possible beam widening.

Since every electric current is naturally linked with a magnetic field, the magnetic field sensor can preferably also be used for the optical detection of an electric current. The statements made with regard to the detection of the magnetic field, and the advantages described, thus apply in a similar way to the use of the magnetic field sensor for detecting the electric current as well.

According to a further beneficial variant, the sensor element constitutes a Pockels element. The Pockels element changes the state of polarization of a passing light signal under the influence of an electric field to be detected. In this case, the polarimetric sensor is then an E-field sensor.

Preference is given to an embodiment of the E-field sensor in which the sensor unit includes phase delay measures. These measures can, for example, represent a $\lambda/4$ or $\pi/2$ delay element. They effect a phase shift between the orthogonal components of the light signal. In this case, the phase delay measures are an integral constituent of the permanently assembled sensor unit, which otherwise includes the polarizer, the Pockels element and the analyzer. For example, in this embodiment, the polarizer can be fitted to the $\lambda/4$ delay element instead of to the sensor element. The permanent joining of the individual components in turn has a beneficial effect with regard to the lowest possible beam widening.

According to a further preferred embodiment, the sensor unit of the E-field sensor contains a Pockels element constructed as a volume element. Due to the beneficial E-field sensitivity, in particular a BSO or a BGO monocrystal, a lithium niobate (LiNbO$_3$) monocrystal or a quartz monocrystal is provided. In this case too, the embodiments of the BSO or BGO monocrystal already mentioned above can be employed.

In a similar way to the use of the magnetic field sensor for the detection of an electric current, an E-field sensor can also be used, in particular, for the optical detection of an electric voltage. The statements made with regard to the detection of the electric field, and the advantages described, therefore apply in a corresponding way to the use of the E-field sensor for detecting the electric voltage as well.

Other features which are considered as characteristic for the invention are set forth in the appended claims.

Although the invention is illustrated and described herein as embodied in a polarimetric sensor for the optical detection of a magnetic field and a polarimetric sensor for the optical detection of an electric current, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
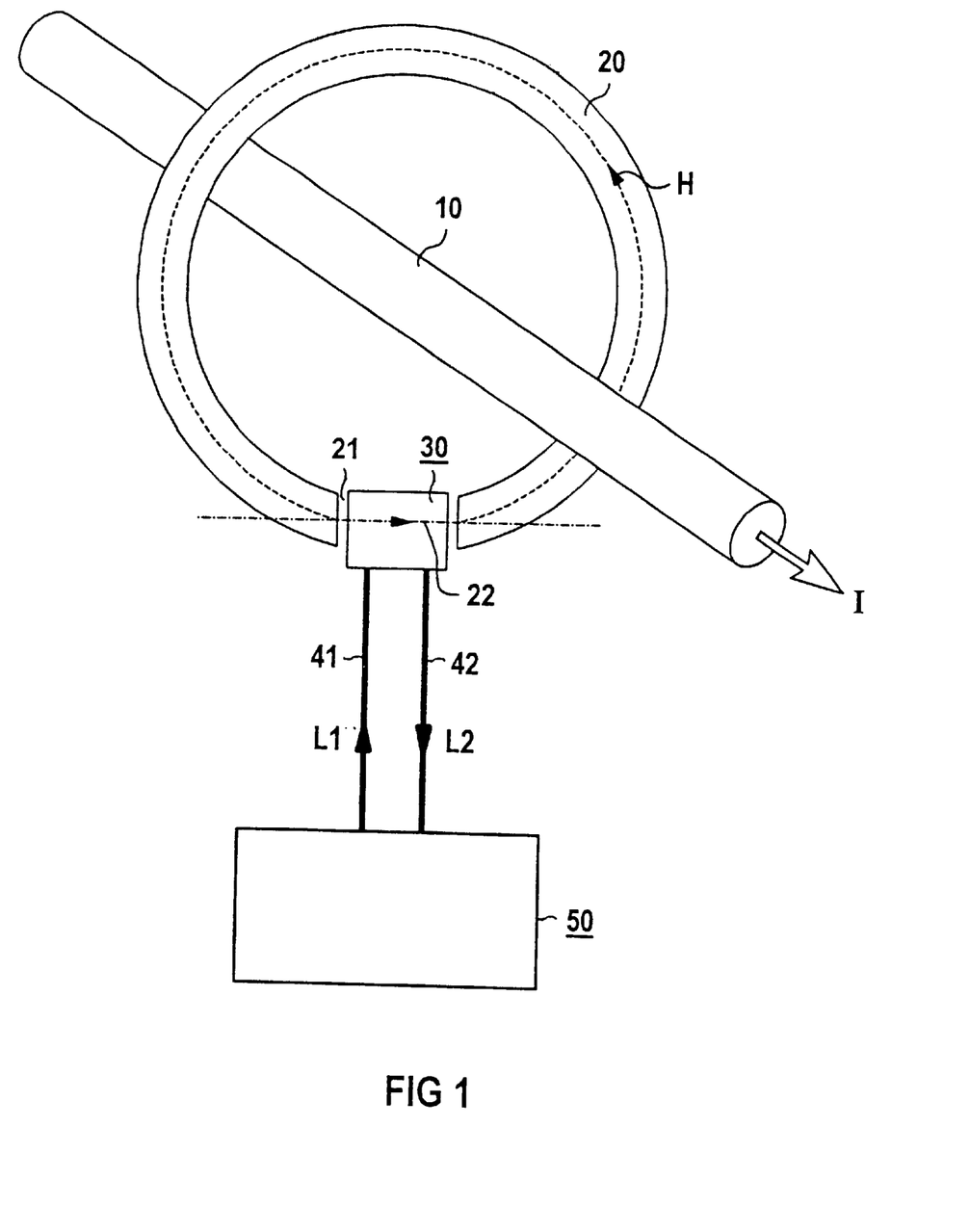
FIG. 1 is a diagrammatic, elevational view of a magnetic field sensor for the optical detection of a magnetic field caused by an electric current.

Referring now in detail to the figures of the drawings, in which mutually corresponding parts are provided with the same reference symbols, and first, particularly, to FIG. 1 thereof, there is seen a magnetic field sensor, which is constructed as a polarimetric sensor, for the optical detection of a magnetic field H. In this case, the magnetic field H is caused by an electric current I which is flowing in a current conductor 10. The current conductor 10 is surrounded by a flux concentrator 20. The flux concentrator 20 is formed of a magnetic material, which otherwise is also used for cores of conventional, inductive converters. In the present case, the flux concentrator is fabricated from a nickel iron alloy. The flux concentrator serves to focus the magnetic field H caused by the current I. The flux concentrator 20 is provided with an air gap 21, which is constructed in such a way that the magnetic field H in the air gap is virtually homogeneously distributed and, in particular, exhibits a uniform field orientation 22. Slight deviations from this uniform field orientation 22 can occur at edges of the air gap 21. However, they are unimportant in the present case.

A magnetic field-sensitive sensor unit 30 is disposed in the air gap 21 of the flux concentrator. The magnetic field-sensitive sensor unit 30 detects the magnetic field H, and therefore the electric current I on which the latter is based, using optical measures. For this purpose, an input optical waveguide 41, which feeds a first light signal L1 to the sensor unit 30, and an output optical waveguide 42, which leads a second light signal L2 away from the sensor unit 30, are provided. Within the sensor unit 30, the light signal L1 coupled into the sensor unit 30 is propagated parallel to the field orientation 22 of the magnetic field H in the air gap 21. The two optical waveguides 41 and 42 are each formed of a plastic, in this case of PMMA. In addition, the two optical waveguides 41 and 42 are constructed as multimode optical waveguides having a core diameter of 1 mm.

The use of plastic optical waveguides primarily provides advantages when, firstly, there is a requirement for a cost-effective current measuring device and, secondly, distances to be bridged by the two optical waveguides 41 and 42 are relatively short, that it to say only a few meters long. In the case of such short distances, the higher attenuation, as compared with glass-fiber optical waveguides, does not play a critical role. The aforementioned conditions are provided, for example, in the public electric power supply area, in the case of applications at a medium voltage level (12 to 36 kV).

The magnetic field sensor illustrated in FIG. 1 satisfies the requirement for a cost-effective implementation, but from a different point of view. The wavelength content of the first light signal L1 and of the second light signal L2 is in the visible wavelength range (400 to 760 nm). As a result, standard components can be used, even for other optical components. This applies both to the sensor unit 30 and to an opto-electronic transmitting/receiving unit 50. The first and second optical waveguides 41 and 42 connect the transmitting/receiving unit 50 and the sensor unit 30 to one another. The transmitting/receiving unit 50 includes a standard light source in the form of an LED (light emitting diode). The LED which is used, Model SFH 752 from Siemens, emits the light signal L1 at a wavelength of 660 nm. In addition, the transmitting/receiving unit includes a photodiode which is sensitive at this wavelength for the detection of the second light signal L2 coming back from the sensor unit 30. The determination of the measured variable in this case is carried out on the basis of an evaluation which is known per se and is normally employed in a magnetic field sensor or a magneto-optical current converter. The transmitting/receiving unit 50 uses information contained in encoded form in the second light signal L2 to calculate a measured variable for the magnetic field H or for the electric current I which causes it in the present case.

Figure 2:
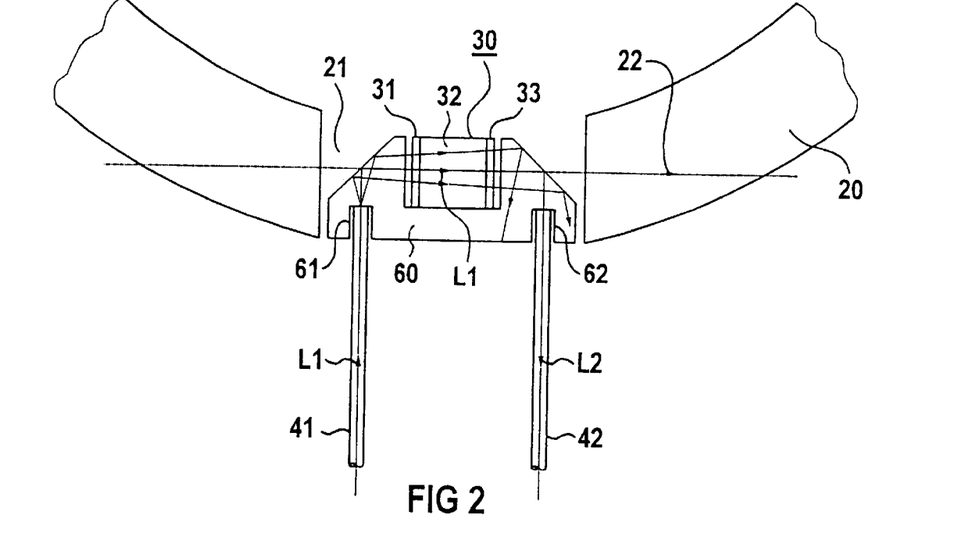
FIG. 2 is an enlarged, fragmentary, elevational view of a configuration of a sensor unit in an air gap of a flux concentrator.
Figure 3:
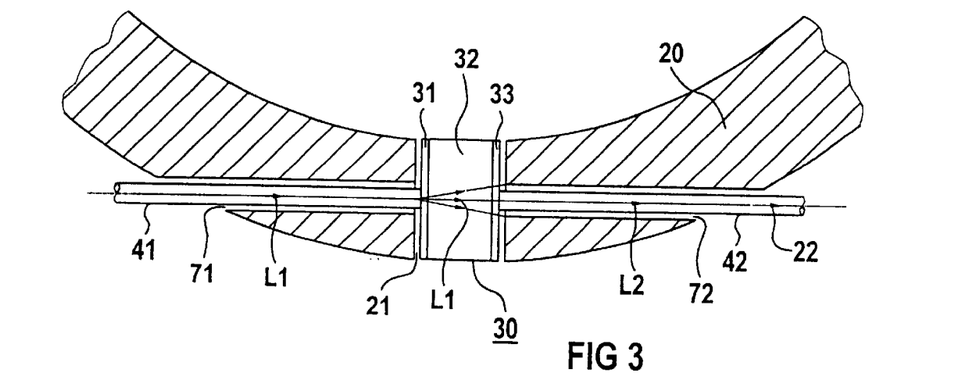
FIG. 3 is a fragmentary, elevational view of a further configuration of a sensor unit in an air gap in a flux concentrator.

Possible implementations of the sensor unit 30 and of guiding light in and out through the input optical waveguide 41 and the output optical waveguide 42 are illustrated in more detail in two exemplary embodiments in FIGS. 2 and 3.

FIG. 2 shows a first implementation example for the configuration of the sensor unit 30 in the air gap 21 of the flux concentrator 20. In this case, the sensor unit 30 contains a Faraday element 32 in the form of a $Bi_{12}SiO_{20}$ monocrystal. The first light signal L1 passes through the Faraday element parallel to the field orientation 22. A thin layer in the form of a dichroic polarization film is applied to each of the side surfaces of the Faraday element 32 which are located opposite each other in the direction of the light. The thin layer applied to the side surface at a light entry is used in this case as a polarizer 31, and the thin layer applied to the side surface at a light exit is used as an analyzer 33. The dichroic polarization films being used are adhesively bonded onto the Faraday element 32. They have a thickness of 0.5 mm. In a non-illustrated alternative exemplary embodiment, the polarizer 31 and the analyzer 33 are each constructed as thin glass platelets which contain aligned silver particles. Such glass platelets can be obtained, for example, from Corning under the production designation Polarcor, in thicknesses between 0.1 mm and 1 mm. In order to ensure the lowest possible beam widening, the layer thickness of the polarizer 31 and of the analyzer 33 is preferably at most 1.5 mm in each case, even in other exemplary embodiments.

The polarizer 31 permits only a proportion of the first light signal L1 having a predetermined plane of polarization to pass. In the subsequent Faraday element 32, this plane of polarization is rotated under the influence of the magnetic field H. This rotation is converted by the analyzer 33 into an intensity modulation. After passing through the sensor unit 30, the first light signal L1 thus carries information, encoded in its intensity, relating to the magnetic field H to be measured or the electric current I causing it. An intensity-encoded light signal can be transmitted very easily to the transmitting/receiving unit 50 through the plastic multimode optical waveguide 42 being used.

In a further non-illustrated alternative embodiment, the first light signal L1 emerging from the Faraday element 32 can be broken down, in a non-illustrated analyzer, into two partial light signals having mutually perpendicular polarization. The two resulting partial light signals in each case in turn carry intensity-encoded measurement information, which is then transmitted appropriately through two optical waveguides to the transmitting/receiving unit 50.

For the purpose of beam guidance as well as in order to hold the two optical waveguides 41 and 42, a prism block 60 that is transparent at the wavelength of 660 nm being used is disposed in the air gap 21. Two bores 61 and 62, which accommodate the input optical waveguide 41 and the output optical waveguide 42, are provided in the prism block 60. The two bores 61 and 62 in each case run at right angles to the field orientation 22. A light course in the sensor unit 30 or, in particular, in the Faraday element 32, which is oriented parallel to the field orientation 22, should nevertheless be ensured. The first light signal L1 that is fed in through the input optical waveguide 41 is deflected at right angles at a prism surface inclined at 45° with respect to the field orientation 22. After passing through the sensor unit 30, which is disposed in a recess in the prism block 60, a second 90° deflection takes place at a further prism surface inclined at 45° with respect to the field orientation 22. A proportion of the first light signal L1 which is adequately large for opto-electrical conversion in the transmitting/receiving unit 50 is therefore coupled into the output optical waveguide 42 as the second light signal L2. The overall result in the prism block 60 is a U-shaped beam path of the first light signal L1. This is therefore a reflex configuration.

The configuration illustrated in FIG. 2 manages without any focussing and/or collimation optics. Beam widening of the first light signal L1 after emerging from the input optical waveguide 41, as far as re-entry into the output optical waveguide 42 is concerned, is kept as low as possible by other measures. For example, materials with the same refractive index or at least with refractive indices which differ from one another by a maximum of 20%, are advantageously provided for the two optical waveguides 41 and 42 and for the prism block 60. In the present case, this is achieved by PMMA being selected as the material both for the two optical waveguides 41 and 42 and for the prism block 60.

In a non-illustrated implementation example, the prism block 60 is constructed as a cast element. In this case, it is produced in its final form with the recess for the sensor unit 30, with the accommodation holes for the two optical waveguides 41 and 42 and with the prism surfaces inclined at 45°. The prism block 60 is produced from a casting compound that is transparent in the wavelength range being used, in particular from plastic.

The large core cross section, above all of the output optical waveguide 42, provides both advantages when coupling the first light signal L1 back in as well as with regard to an adjustment tolerance to be complied with during fabrication. The plastic optical waveguides 41 and 42 with a large core cross section are significantly less sensitive in this regard than glass-fiber optical waveguides, which otherwise are normally employed for a magnetic field sensor.

FIG. 3 shows another implementation example of a configuration of the sensor unit 30 in the air gap 21. One significant difference as compared with the implementation example of FIG. 2 is that no beam reversal of the first light signal L1 is carried out in the air gap 21. Instead, the implementation example of FIG. 3 is a purely transmissive configuration. The input optical waveguide 41 and the output waveguide 42 are led to the air gap 21 parallel to the field orientation 22 in the implementation example of FIG. 3. To this end, respective bores 71 and 72 are each provided on one side of the air gap 21 in the flux concentrator 20. Each of the two bores 71 and 72 originate from an outer wall of the flux concentrator 20 and end in the air gap 21. The two bores 71 and 72 also accommodate the input optical waveguide 41 and the output optical waveguide 42, in a manner corresponding to the example of FIG. 2. In this case, only the sensor unit 30 is located in the air gap 21. The input optical waveguide 41 and the output optical waveguide 42 touch the sensor unit 30. An additional component, for example in the form of a prism block, is not required in the implementation example of FIG. 3. The configuration of FIG. 3 is distinguished by a rectilinear beam path. This additionally simplifies assembly.

The sensor unit 30 shown in FIG. 3 also includes an optical series circuit of the polarizer 31, the Faraday element 32 and the analyzer 33, in a manner analogous to the exemplary embodiment shown in FIG. 2. The polarizer 31 and the analyzer 33 are again formed as polarization films, which are applied to the $Bi_{12}SiO_{20}$ monocrystal of the Faraday element 32.

Figure 4:
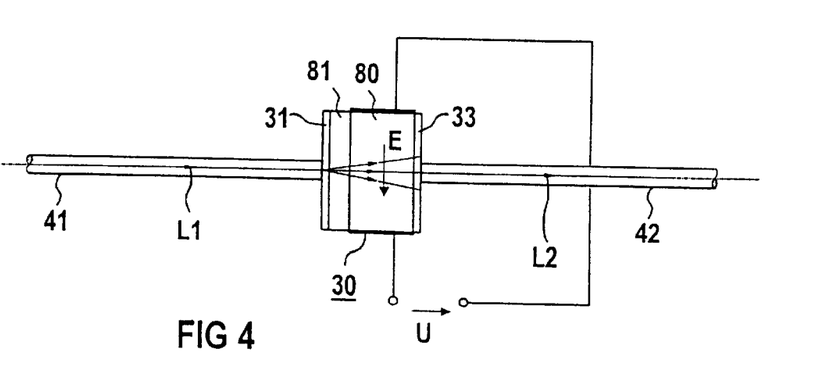
FIG. 4 is an elevational view of an E-field sensor for the optical detection of an electric field caused by an electric voltage.

FIG. 4 illustrates an E-field sensor, as a polarimetric sensor, for the optical detection of an electric field E. The construction of the E-field sensor essentially corresponds in this case to that of the magnetic field sensor of FIG. 3. In particular, this is again a reflection-free, purely transmissive configuration. In addition, all of the locally adjacent individual components are also in direct contact with one another in this case. This results in low beam widening, so that a large proportion of the first light signal L1 is coupled as the second light signal L2 into the second optical waveguide 42.

The sensor unit 30 of the E-field sensor of FIG. 4 contains the polarizer 31, a $\lambda/4$ delay element 81, a Pockels element 80 and the analyzer 33. The Pockels element 80, which is formed as a quartz monocrystal, is connected to an electric voltage U by diagrammatically illustrated electrodes. The electric voltage U causes the electric field E to be detected in the Pockels element.

It is beneficial if the first light signal L1 has circular polarization as it enters the Pockels element 80, that is to say if there is a λ/4 or a π/2 phase shift between two mutually orthogonally polarized components of the first light signal L1. The λ/4 delay element 81 disposed between the polarizer 31 and the Pockels element 80 effects precisely such a phase shift between the two orthogonal components of the first light signal L1. The state of the circular polarization present when the first light signal L1 enters the Pockels element 80 is transferred into a state of elliptical polarization under the influence of an electric voltage U, or under the influence of an electric field E, depending on the value of the measured variable. This change in polarization is then used by the evaluation unit 50, which is not illustrated in FIG. 4, to determine the fundamental value of the electric field E.

We claim:

1. A polarimetric sensor for the optical detection of a magnetic field, comprising:
   a) a flux concentrator having an air gap and effecting an essentially uniform field orientation of a magnetic field in said air gap;
   b) a permanently assembled sensor unit disposed in said air gap and including at least one polarizer, a Faraday element sensitive to the magnetic field and an analyzer;
   c) an input optical waveguide;
   d) an output optical waveguide with a core diameter of at least 100 μm;
   e) said sensor unit, said input optical waveguide and said output optical waveguide configured to cause a first light signal emerging from said input optical waveguide to enter said sensor unit in uncollimated and unfocussed form, then to pass through said sensor unit and then to enter said output optical waveguide in uncollimated and unfocussed form as a second light signal;
   f) said Faraday element defining an optical path of said first light signal through said Faraday element having a length of at most 50 times said core diameter of said output optical waveguide; and
   g) a prism block being transparent in a wavelength range being used, said prism block disposed in said air gap and said sensor unit embedded in said prism block, said prism block having two bores formed therein perpendicularly to said field orientation for receiving said input optical waveguide and said output optical waveguide, and said prism block having two prism surfaces each inclined at 45° to said field orientation and each effecting a 90° deflection of said first light signal and said second light signal.

2. The polarimetric sensor according to claim 1, wherein said length of said optical path of said first light signal through said Faraday element is at most ten times said core diameter of said output optical waveguide.

3. The polarimetric sensor according to claim 1, wherein said Faraday element has mutually opposite sides, and said polarizer and said analyzer are thin layers disposed along an optical path on said mutually opposite sides of said Faraday element.

4. The polarimetric sensor according to claim 3, wherein said thin layers are dichroic polarization films.

5. The polarimetric sensor according to claim 4, wherein said dichroic polarization films have a layer thickness of at most 1.5 mm.

6. The polarimetric sensor according to claim 1, wherein at least one of said optical waveguides is formed of a plastic.

7. The polarimetric sensor according to claim 6, wherein said plastic is polymethyl methacrylate.

8. The polarimetric sensor according to claim 1, wherein at least one of said optical waveguides is formed as a multimode optical waveguide.

9. The polarimetric sensor according to claim 1, wherein said core diameter of said output optical waveguide is at least 500 μm.

10. The polarimetric sensor according to claim 1, wherein said core diameter of said output optical waveguide is at least 1 mm.

11. The polarimetric sensor according to claim 1, wherein said sensor unit conducts visible light.

12. The polarimetric sensor according to claim 1, wherein said sensor unit conducts infrared light.

13. The polarimetric sensor according to claim 1, including a transmitting/receiving unit generating said first light signal and using said second light signal to derive a measured signal for the magnetic field, said input optical waveguide and said output optical waveguide each having an end facing away from said sensor unit and connected to said transmitting/receiving unit.

14. The polarimetric sensor according to claim 1, wherein said prism block is formed of a material having a refractive index at least approximately equal to said input optical waveguide and said output optical waveguide.

15. The polarimetric sensor according to claim 1, wherein said prism block, said input optical waveguide and said output optical waveguide are formed of the same plastic.

16. The polarimetric sensor according to claim 15, wherein said plastic is polymethyl methacrylate.

17. The polarimetric sensor according to claim 1, wherein said Faraday element is a volume element formed of a material selected from the group consisting of a monocrystalline bismuth silicon oxide, a monocrystalline bismuth germanium oxide, a ferromagnetic material, and a flint glass.

18. The polarimetric sensor according to claim 17, wherein said ferromagnetic material is selected from the group consisting of a rare earth garnet and an yttrium iron garnet.

19. A polarimetric sensor for the optical detection of an electric current, comprising:
   a) an electric conductor carrying an electric current causing a magnetic field;
   b) a flux concentrator having an air gap and effecting an essentially uniform field orientation of the magnetic field in said air gap;
   c) a permanently assembled sensor unit disposed in said air gap and including at least one polarizer, a Faraday element detecting the magnetic field and an analyzer;
   d) an input optical waveguide;
   e) an output optical waveguide with a core diameter of at least 100 μm;
   f) said sensor unit, said input optical waveguide and said output optical waveguide configured to cause a first light signal emerging from said input optical waveguide to enter said sensor unit in uncollimated and unfocussed form, then to pass through said sensor unit and then to enter said output optical waveguide in uncollimated and unfocussed form as a second light signal;
   g) said Faraday element defining an optical path of said first light signal through said Faraday element having a length of at most 50 times said core diameter of said output optical waveguide; and h) a prism block being transparent in a wavelength range being used, said prism block disposed in said air gap and said sensor unit embedded in said prism block, said prism block having two bores formed therein perpendicularly to said field orientation for receiving said input optical waveguide and said output optical waveguide, and said prism block having two prism surfaces each inclined at 45° to said field orientation and each effecting a 90° deflection of said first light signal and said second light signal.

* * * * *

UNITED STATES PATENT AND TRADEMARK OFFICE
CERTIFICATE OF CORRECTION

PATENT NO. : 6,512,357 B2
DATED : January 28, 2003
INVENTOR(S) : Thomas Bosselmann et al.

It is certified that error appears in the above-identified patent and that said Letters Patent is hereby corrected as shown below:

<u>Title page,</u>
Item [63], should read as follows:

-- Related U.S. Application Data

Continuation of application No. PCT/DEP99/02226, filed on Jul. 16, 1999. --

Signed and Sealed this

Twentieth Day of May, 2003

JAMES E. ROGAN
*Director of the United States Patent and Trademark Office*